June 23, 1970 D. G. DOW 3,517,335

MICROWAVE CIRCUIT FOR A LIMITED SPACE CHARGE ACCUMULATION MODE DEVICE

Filed May 13, 1968

INVENTOR.

DANIEL G. DOW

BY

ATTORNEY

United States Patent Office 3,517,335

Patented June 23, 1970

3,517,335
MICROWAVE CIRCUIT FOR A LIMITED SPACE CHARGE ACCUMULATION MODE DEVICE

Daniel G. Dow, Palo Alto, Calif., assignor to Varian Associates, Palo Alto, Calif., a corporation of California Filed May 13, 1968, Ser. No. 728,699
Int. Cl. H03b 7/14
U.S. Cl. 331—101 6 Claims

ABSTRACT OF THE DISCLOSURE

A microwave circuit for an LSA mode semiconductor bulk effect diode in which the capacitance of the bulk effect diode is series resonated with an inductance in series with the load resistance. The inductance has a relatively high surge impedance for limiting the current into the diode and for storing sufficient energy such that when the diode reaches its negative resistance threshold the energy stored in the inductor is transferred to the capacitance of the diode and thence back to the inductor to drive the voltage across the diode below its threshold. In this manner the diode is caused to operate stably in the LSA mode. In one physical embodiment of the microwave circuit, the diode is mounted between the end of the center conductor of a coaxial line and a conductive plug closing off the end of the coaxial line and being insulated from the outer conductor thereof.

The invention herein described was made in the course of or under a contract or subcontract thereunder, (or grant) with the United States Air Force.

DESCRIPTION OF THE PRIOR ART

Heretofore, some bulk effect semiconductive devices have been operated in the limited space charge accumulation mode. In these prior circuits, the semiconductive device was connected in parallel with an inductor and with a load. The inductor was resonated with the capacitance of the bulk effect device at a certain microwave frequency. An example of such a prior art X-band oscillator is described in an article titled "High Power Pulsed Microwave Generation in Gallium Arsenide" appearing in the Proceedings of the IEEE of March 1967 pp. 434–435. The limited space charge accumulation mode of operation is also fully described in an article titled "LSA Oscillator-Diode Theory" appearing in the Journal of Applied Physics, vol. 38, No. 8 of July 1967, pp. 3096–3101.

One of the problems associated with the prior art microwave circuit, which had the bulk effect device connected in parallel with an inductance and the load, was that it was extremely difficult to control proper operation of the device on the desired limited space charge accumulation mode and quite often the device would begin to operate in an undesired transit time mode. Attempts to overcome the difficulties associated with starting in the proper mode have involved use of a reflector provided in the circuit between the load and the device such as to set up a standing wave to delay loading of the diode by the load until LSA oscillations have started. An example of such a circuit is found in an article by J. A. Copeland and R. R. Spiwak, International Solid State Circuits Conference, Philadelphia, Feb. 15, 1967. While the provision of a reflector between the bulk effect device and the load for setting up a standing wave provides a satisfactory way of controlling operation on the desired LSA mode this reflector introduces a substantial complexity into the microwave circuit and it is desired to obtain a microwave circuit which avoids this complexity and which will therefore be simplified and more economical to manufacture.

SUMMARY OF THE PRESENT INVENTION

A principal object of the present invention is the provision of an improved microwave circuit for a limited space charge accumulation mode device.

One feature of the present invention is the provision, in a microwave circuit for a limited space charge accumulation mode device, of an inductance which is connected in series with the bulk effect device and the load, such inductance being resonated with the capacitance of the bulk effect device at a microwave frequency to cause said bulk effect device to operate on the limited space charge accumulation mode to the exclusion of other possible modes of operation, whereby the operational stability of the device is enhanced. Another feature of the present invention is the same as the preceding feature wherein the microwave circuit comprises a section of coaxial transmission line and the inductance which is connected in series with the bulk effect device comprises a portion of the center conductor of the transmission line.

Another feature of the present invention is the same as the preceding feature wherein a conductive plug is disposed at one end of the coaxial transmission line in electrically insulative relation with respect to the outer conductor of the line, and wherein the bulk effect device is connected between the plug and one end of the center conductor, whereby a bias potential is readily applied across the bulk effect device.

Other features and advantages of the present invention will become apparent upon a perusal of the following specification taken in connection with the accompanying drawings wherein:

DESCRIPTION OF THE PREFERRED EMBODIMENTS

Figure 1:
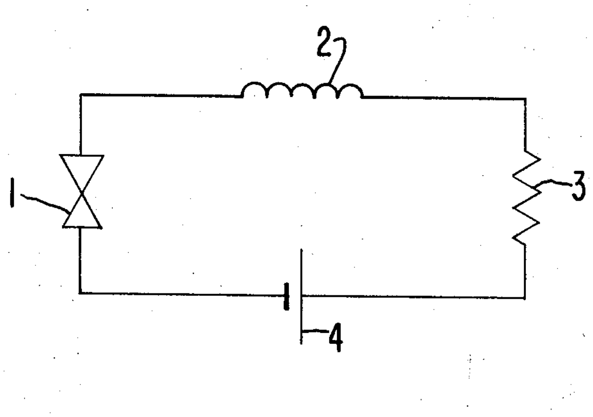
FIG. 1 is a simplified schematic circuit diagram of a microwave oscillator incorporating features of the present invention.

Referring now to FIG. 1 there is shown a schematic microwave circuit incorporating features of the present invention. More specifically, a solid state bulk effect device 1 capable under certain conditions of presenting a negative resistance to a microwave circuit is connected in series with an inductor 2 and a load resistor 3 across a source of bias potential 4. Suitable bulk effect diode devices 1 are conventially known from the prior art but, briefly, an example of such a device 1 would be a single crystal of gallium arsenide doped with a donor concentration of $5\times10^{20}$ donors per cubic meter, having a length of approximately $4\times10^{-5}$ meters, and a cross sectional area of $8\times10^{-7}$ square meters with a pair of electrodes at opposite ends. The length of the crystal is greater than the distance a charge carrier can travel in one cycle at the operating frequency of the device, thus, making its length greater than those devices dimensioned for transit time modes of operation (Gunn modes). Such a device would have a capacitance of approximately $2\times10^{-12}$ farads.

The capacitance of the bulk effect device 1 is resonated with the inductance of inductor 2 at a microwave frequency preferably substantially above the desired operating frequency of the oscillator. More particularly, the efficiency of operation can be expected to approach 20% when the operating frequency is only 50% of the resonant frequency of the inductance of indicator 2 with the capacitance of the bulk effect device 1. As used herein, the capacitance of the bulk effect device is the geometric capacitance, i.e., the computed capacitance taking into account the dielectric constant of the material and its length and the areas of the electrodes at opposite ends thereof.

A typical resistance for the load resistor 3 would be approximately ⅓ of the characteristic impedance, $\sqrt{L/C}$ seen by the load resistor looking back at the series connection of the inductor 2 and the capacitance of the bulk effect device 1.

Figure 3:
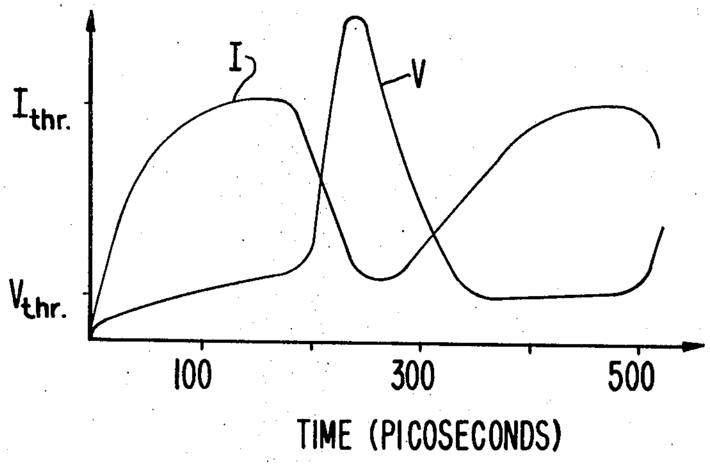
FIG. 3 is a plot of current and voltage versus time depicting the characteristics of the bulk effect device in the microwave circuit of the present invention.

In operation, upon the application of the bias voltage which may be D.C. or pulsed, the current is limited by the inductance of inductor 2 and rises with a time constant given by the inductor 2, the resistance of the resistor 3, and the resistance of the bulk effect device 1 below threshold. The current and voltage characteristics for the bulk effect device 1, as incorporated in the circuit of FIG. 1, is shown in FIG. 3. When the current reaches threshold, $I_{thr}$, the system enters a new regime. The current to the inductor 2 cannot change rapidly, yet the bulk effect device 1 cannot accept it all, so the capacitance of the bulk effect device 1 is rapidly charged to a high value, giving the peak of voltage shown in the voltage curve of FIG. 3. In the next quarter cycle, the voltage drops, and the critical part of the cycle is reached. If the energy initially stored in the inductor 2 is great enough to drive the voltage below threshold, the bulk effect device 1 will operate in the LSA mode. The resultant oscillation exhibits a relaxation form, approximately half of the cycle being below threshold and the other half in a hig half-sinusoid voltage above threshold.

Figure 2:
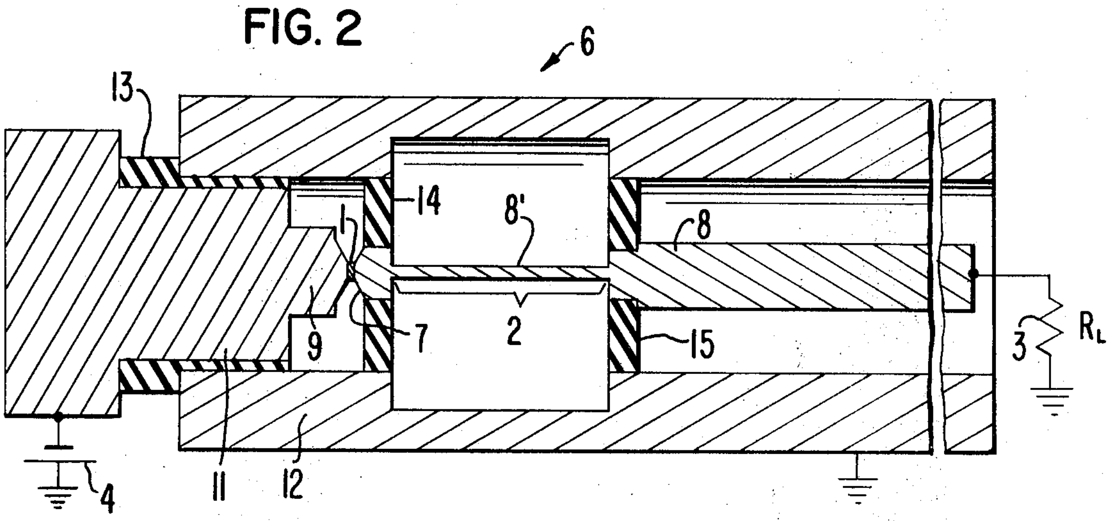
FIG. 2 is a longitudinal sectional view, partly in schematic form, of a microwave oscillator of the present invention.

Referring now to FIG. 2 there is shown a physical realization of the microwave circuit schematically indicated in FIG. 1. More specifically, the bulk effect device 1 is mounted within a coaxial line 6 between one end 7 of the center conductor 8 and a conductive projection 9 extending toward the end of the center conductor from a conductive plug 11 disposed closing off one end of the coaxial line 6. The plug is insulated from the outer conductor 12 of the coaxial line 6 by a dielectric sleeve 13, as of Teflon. The outer conductor 12 of the coaxial line 6 is grounded and bias potential is applied from source 4 to one side of the bulk effect device 1 via conductive plug 11. The end 7 of the center conductor 8 which is adjacent the bulk effect device 1 is supported from the outer conductor 12 via an annular dielectric support member 14, as of Teflon.

The series inductor 2 is formed by a length 8' of the center conductor 8 which has been reduced in cross sectional area to increase its inductance. Likewise, a corresponding length of the outer conductor 12 has been enlarged in inside diameter to further increase the series inductance of the coaxial line 6. A second annular dielectric support member 15 is disposed at the load end of the inductor 2 such that the small diameter section of center conductor 8' is adequately supported. The load resistor 3 is connected to the other end of the center conductor 8 between the center conductor and ground. Typically, the load resistance 3 has a value which is approximately equal to the characteristic impedance of the coaxial line formed by the center conductor 8 and the shell 12, 6. Typically, the Q of the resonant circuit is on the order of 3, thus constituting a very low Q circuit as compared to the prior art relatively high Q parallel resonant circuits.

Although the series inductor 2 has been depicted as a length of the center conductor having reduced cross sectional area, this inductor may be formed by a helical section of the center conductor if additional inductance is desired.

Oscillation of a circuit of the present invention is possible for a range of doping for the bulk effect device 1. More specifically, for a circuit resonance $$f=\frac{1}{2\pi\sqrt{LC}}$$

the doping may range from $2.5\times10^{10}\ f$ electrons per cubic meter up to $1\times10^{11}\ f$ electrons per cubic meter. At the lower range of doping, the device may be D.C. stable and not oscillate, while at the higher doping, the Gunn mode may be initiated or the peak voltages and fields become excessive. The optimum doping, for a circuit resonant frequency of 8 gigahertz is approximately $5\times10^{20}$ per cubic meter. Performance of the circuit is essentially independent of the length of the bulk effect device, so long as bulk effect device 1 has a length longer than required for Gunn effect oscillation (transmit time mode) at its operating frequency and provided it is prevented from operating in the Gunn mode at its transit time frequency.

Since many changes could be made in the above construction and apparently widely different embodiments of this invention could be made without departing from the scope thereof, it is intended that all matter contained in the above description or shown in the accompanying drawings shall be interpreted as illustrative and not in a limiting sense.

What is claimed is:

1. In a limited space charge accumulation mode microwave circuit, means forming a solid state bulk effect device capable under certain conditions of presenting a negative resistance to a microwave circuit coupled thereto, means forming a microwave circuit coupled to said bulk effect device for extracting microwave energy from said device for transmission to a resistive load, means for applying a bias electrical potential across said bulk effect device, the improvement wherein, said microwave circuit includes an inductor electrically connected in series with said bulk effect device and the resistance of the load, said bulk effect device having a capacitance, and the inductance of said inductor and the capacitance of said bulk effect device having values to be series resonant at a microwave frequency substantially higher than the microwave frequency at which microwave energy is to be extracted from said bulk effect device, and said inductor having an inductance of sufficient magnitude to store sufficient energy during each cycle to drive the voltage developed across said bulk effect device below threshold voltage for approximately a half cycle during each cycle of oscillation to cause said bulk effect device to operate in a limited space charge accumulation mode for converting bias power into microwave energy.

2. The apparatus of claim 1 wherein said microwave circuit is a section of coaxial line having an outer conductor surrounding an inner conductor, and wherein said inductor comprises a certain portion of said inner conductor of said coaxial line.

3. The apparatus of claim 2 wherein said inductor portion of said inner conductor has a smaller characteristic cross sectional area than the characteristic cross sectional area of the remaining portion of said inner conductor.

4. The apparatus of claim 2 wherein said bulk effect device includes a semiconductor body having a pair of electrodes connected thereto at opposite ends of said body, and said body having a length between said electrodes which is in excess of the distance charge carriers in said semiconductive body will travel during one cycle at the frequency of the microwave energy extracted from said device.

5. The apparatus of claim 2 wherein said means for applying the bias potential to said device includes a conductive plug closing off one end of said coaxial line, means for insulatively supporting said plug within and with respect to said outer conductor, means forming a conductive connection between said plug and one terminal of said bulk effect device, means forming a conductive connection between said outer conductor and a second terminal of said bulk effect device, and means for applying a bias potential to said plug relative to the potential of said outer conductor for applying the bias potential across said bulk effect device.

6. The apparatus of claim 1 wherein said bulk effect device comprises a gallium arsenide crystal, said crystal being doped with a donor dopant concentration falling within the range of $2.5\times10^{10}f$ to $1\times10^{11}f$ donors per cubic meter, where $f$ is the circuit series resonance frequency.

References Cited

UNITED STATES PATENTS

| | | | |
|---|---|---|---|
| 3,249,891 | 5/1966 | Rutz | 331—107 |
| 3,416,098 | 12/1968 | Vane | 331—107 |

OTHER REFERENCES

Carroll, "Resonant-Circuit Operation of Gunn Diodes: A Self-Pumped Parametric Oscillator," Electronics Letters, June 1966, pp. 215, 216.

Hanson et al., "Microwave Circuit Characteristics of Bulk GaAs Oscillators," IEEE Transactions on Electron Devices, September 1967, pp. 469–476.

ROY LAKE, Primary Examiner

S. H. GRIMM, Assistant Examiner

U.S. Cl. X.R.

317—234; 331—107